(12) United States Patent  
Mirow

(10) Patent No.: US 7,466,178 B2  
(45) Date of Patent: Dec. 16, 2008

(54) MULTIVIBRATOR WITH REDUCED AVERAGE OFFSET VOLTAGE

(76) Inventor: Fred Mirow, 118 Cornell Rd., Bala Cynwyd, PA (US) 19004

( * ) Notice: Subject to any disclaimer, the term of this patent is extended or adjusted under 35 U.S.C. 154(b) by 115 days.

(21) Appl. No.: 11/301,009

(22) Filed: Dec. 12, 2005

(65) Prior Publication Data

US 2006/0181360 A1  Aug. 17, 2006

Related U.S. Application Data

(60) Provisional application No. 60/652,812, filed on Feb. 15, 2005.

(51) Int. Cl.  
*H03K 3/10* (2006.01)

(52) U.S. Cl. .................. 327/227; 331/144; 331/145

(58) Field of Classification Search ......... 331/144–145; 327/227, 228, 306  
See application file for complete search history.

(56) References Cited

U.S. PATENT DOCUMENTS

| | | | | | |
|---|---|---|---|---|---|
| 4,057,740 | A | * | 11/1977 | Arguello | 327/175 |
| 4,380,746 | A | * | 4/1983 | Sun et al. | 332/108 |
| 6,137,373 | A | * | 10/2000 | Mori | 331/145 |
| 6,281,732 | B1 | * | 8/2001 | Mirow | 327/227 |

FOREIGN PATENT DOCUMENTS

| JP | 37417 | * | 1/1991 |
|---|---|---|---|
| JP | 05152906 | * | 6/1993 |

* cited by examiner

*Primary Examiner*—Tuan T Lam

(57) ABSTRACT

This invention relates to monostable and astable multivibrators in which the pulse width or frequency stability, respectively is increased by reducing the effect of the comparator input offset voltage. The reduction is accomplished by alternately reversing the input connections to the comparator.

9 Claims, 5 Drawing Sheets

MULTIVIBRATOR WITH REDUCED AVERAGE OFFSET VOLTAGE

CROSS-REFERENCE TO RELATED APPLICATIONS

The benefits of filing this invention as Provisional application for patent "MULTIVIBRATOR WITH REDUCED AVERAGE OFFSET VOLTAGE", U.S. PTO 60/652,812 filed Feb. 15, 2005 by Fred Mirow are claimed.

BACKGROUND ART

One of the problems associated with multivibrators is that its comparator switching transition level is very sensitive to changes in ambient temperature and power supply voltage. This change causes the multivibrator to have variations in the pulse duration time or oscillation frequency. To reduce this instability some form of compensation is necessary. One of the methods used is to use a FET as a resister to control the charging time of a capacitor. The FET resistance value is controlled by a temperature dependent voltage, which varies to maintain a constant capacitor charging time. This is described in U.S. Pat. No. 4,547,749 issued to Clinton Kuo. Another method is to use a constant current source circuit, which is designed to be temperature independent, to charge and discharge a timing capacitor. This is described in U.S. Pat. No. 4,714,901 issued to Jain et al.

In these methods the variation in pulse width or oscillator frequency has been reduced by controlling the charging time of capacitors, but nothing has been done to correct an other large error source, the comparator input offset voltage and its sensitivity to temperature and supply voltage change.

SUMMARY OF THE INVENTION

The object of this invention are monostable and astable multivibrators in which the pulse width or frequency stability, respectively is increased by reducing the effect of the comparator input offset voltage. The reduction is accomplished by alternately reversing the input connections to the comparator. This maintains a constant average switching transition level which allows the multivibrator to maintain high stability even as power supply voltage level and operating temperature change.

There are many different well known multivibrator circuits, but they all use the principle of using the time period required to charge and or discharge a capacitor to one or more voltage levels to determine the output pulse width or frequency. The capacitor voltage level is sensed by one or more comparators which provide a output signal indicating if the voltage level is below or above that of a reference voltage level. In practice comparators have an internal offset voltage that changes the capacitor voltage level at which the comparators output signal changes relative to the reference voltage. This offset voltage changes the multivibrator operating frequency or pulse width since as the required capacitor voltage level changes the required charge and or discharge time changes.

The change in the average pulse width or oscillator frequency can be reduced by reducing the average input offset voltage of the comparators to substantially zero volts over multiple output pulses or cycles of oscillation. The difference of the individual pulse width will depend on the comparators offset voltage however the average pulse width will remain substantially constant. By applying the multivibrator output frequency signal to well known circuits such as frequency dividers a constant pulse width or duty cycle output signal can be obtained that is determined by the multivibrators average pulse width or frequency. By maintaining the comparators average input offset voltage at substantially zero volts, the pulse width or oscillator frequency stability is increased.

DETAILED DESCRIPTION

The present invention is directed to increasing the multivibrator average pulse width or frequency stability by reducing the average circuit value of the comparator offset voltage. As explained in detail below, the multivibrator contains at least one differential input comparator which is connected by switching means to timing and voltage reference circuits.

Figure 1:
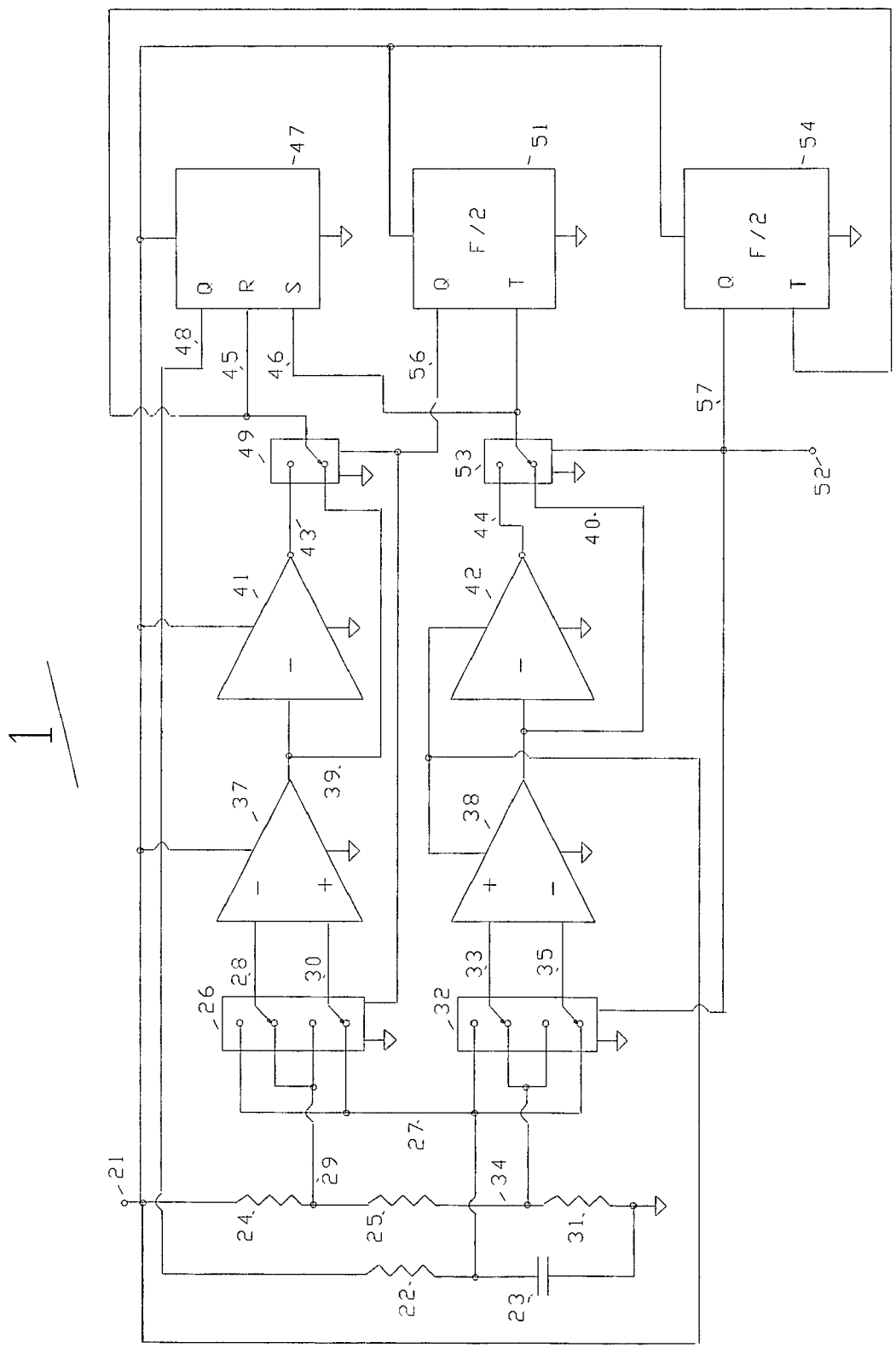
FIG. 1 is a schematic representation of astable multivibrator 1 in accordance with one embodiment of the present invention.

FIG. 1 shows an exemplary astable multivibrator 1 in accordance with an embodiment of the present invention. However, this invention may be applied to any multivibrator that uses one or more differential input comparators. The DC input voltage is applied to terminal 21 and powers comparators 37 and 38, inverters 41 and 42, R S flip flop 47, and frequency dividers 51 and 54. The multivibrator 1 output signal is at terminal 52. Switching means 26, 32, 49, and 53 may use relays or well known transistor circuits to accomplish the function.

Figure 2:
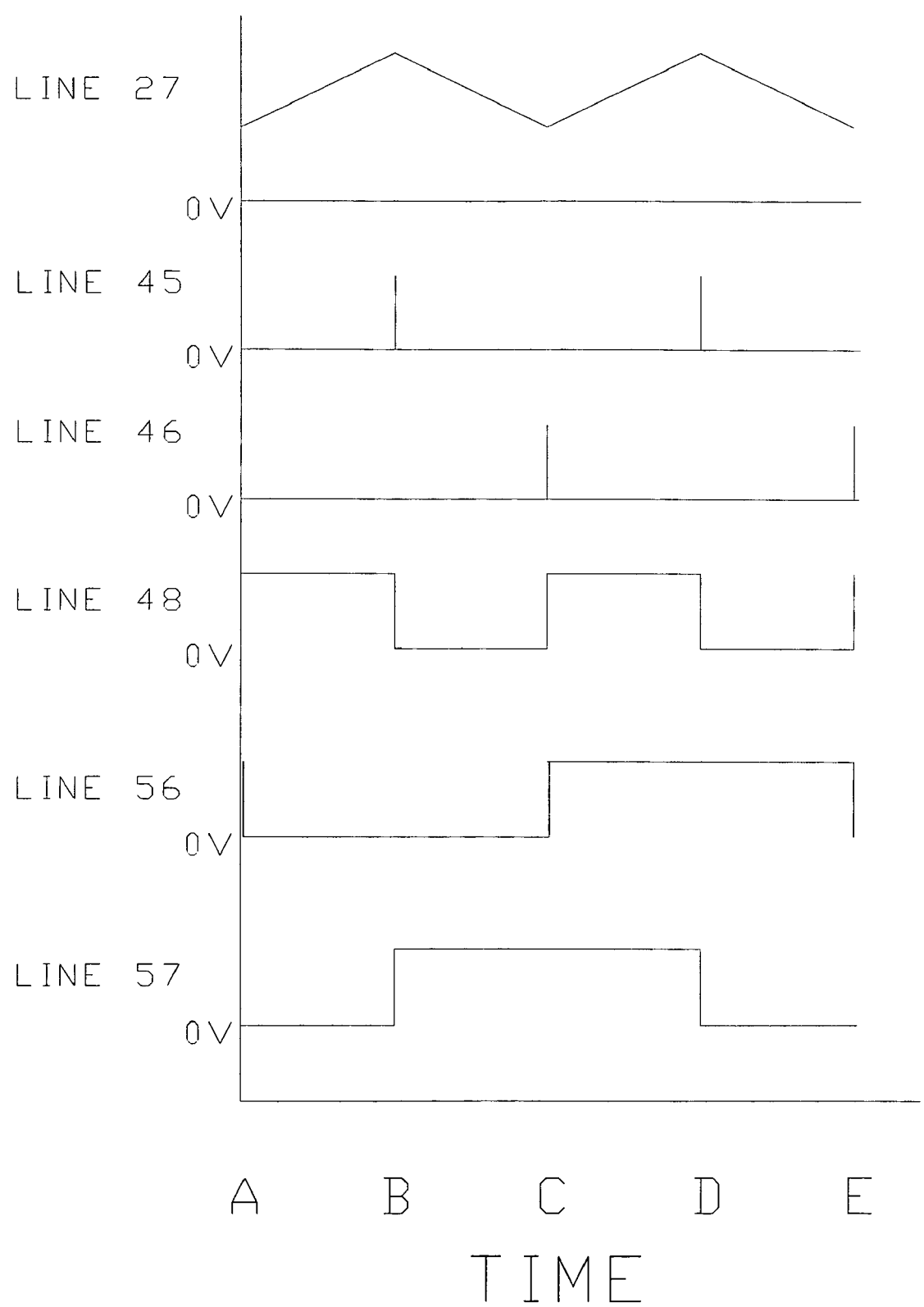
FIG. 2 is a diagram illustrating various astable multivibrator 1 circuit waveforms.

Referring also to FIG. 2, at time A line 48 goes high (essentially equal to the DC input voltage level), timing capacitor 23 begins charging through resistor 22. Instead of resistor 22, it is understood that current sources could have been used. The voltage level on line 27 is connected through switch means 26 to comparator 37 non inverting input line 30 and through switch means 32 to comparator 38 inverting input line 35. DC reference voltages are obtained from the resistor voltage divider network consisting of resistors 24, 25, and 31 connected between terminal 21 and ground. The DC reference voltages on line 29 is higher than that on line 34. Line 29 is connected through switch means 26 to comparator 37 inverting input line 28, and line 34 through switch means 32 to comparators 38 non inverting input line 33.

At time B, the voltage level of timing capacitor 23 exceeds the DC reference voltage level on line 29 plus comparator 37 offset voltage, the output of comparator 37 output on line 39 goes high. Line 39 is connected through switch means 49 to input line 45 of R S flip flop 47, which functions as a latch, and frequency dividers 54. R S flip flop 47 output on line 48 goes low (essentially 0 volts) and timing capacitor 23 begins being discharged through resistor 22. Also the output of frequency dividers 54 on line 57 goes high causing switch means 32 and 53 to change connections. Comparator 38 input line 35 is now connected to line 34 and input line 33 is connected to line 27. Line 46 is now connected to the output of inverter 42 on line 44. The output of inverter 42 is the inverted signal level of comparator 38 output.

At time C, the voltage level of timing capacitor 23 is less than the DC reference voltage level on line 34 minus comparator 38 offset voltage, the output of comparator 38 output on line 40 goes low and the output of inverter 42 goes high. Line 44 is connected through switch means 53 to R S flip flop 47 and frequency dividers 51 input line 46. R S flip flop 47 output on line 48 now goes high and timing capacitor 23 again begins being charged. Also the output of frequency dividers 51 on line 56 goes high causing switch means 26 and 49 to change connections. Comparator 37 input line 30 is now connected to line 29 and input line 28 is connected to line 27. Line 45 is now connected to the output of inverter 41 on line 43. The output of inverter 41 is the inverted signal level of comparator 37 output.

At time D, the voltage level of timing capacitor 23 exceeds the DC reference voltage level on line 29 minus comparator 37 offset voltage, the output of comparator 37 output on line 39 goes low and the output of inverter 41 goes high. Line 43 is connected through switch means 49 to line 45. R S flip flop 47 output on line 48 goes low and timing capacitor 23 begins being discharged through resistor 22. Also the output of frequency dividers 54 on line 57 goes low causing switch means 32 and 53 to change connections. Comparator 38 input line 35 is now connected to line 27 and input line 33 is connected to line 34. Line 46 is now connected to the output of comparator 38 line 40.

At time E, the voltage level of timing capacitor 23 is less than the DC reference voltage level on line 34 plus comparator 38 offset voltage, the output of comparator 38 output on line 40 goes high. Line 40 is connected through switch means 53 to R S flip flop 47 and frequency dividers 51 input line 46. R S flip flop 47 output on line 48 now goes high and timing capacitor 23 again begins being charged. The output of frequency dividers 51 on line 56 goes low causing switch means 26 and 49 to change connections. Multivibrator 1 has now finished a complete cycle of operation and has returned to the same state as at time A and continues repeating the operation.

Figure 3:
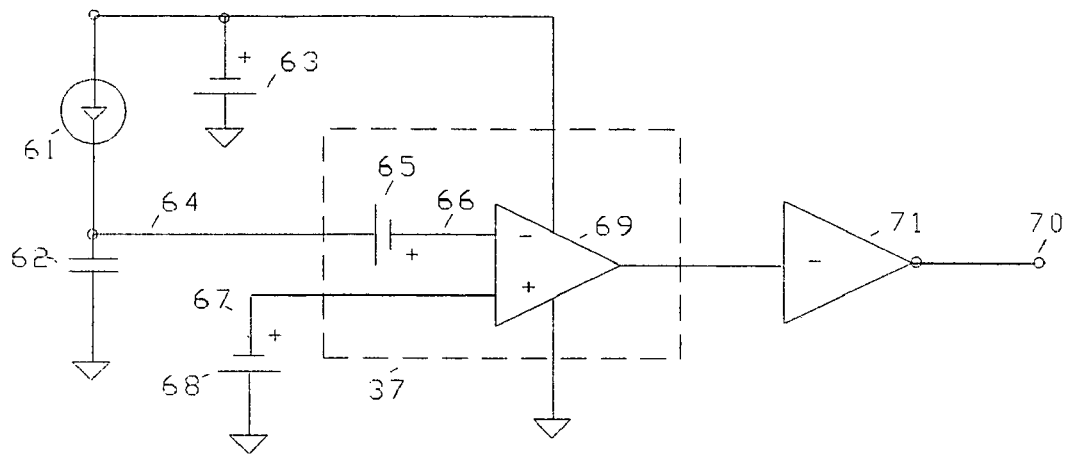
FIG. 3 shows a simplified circuits showing the effect of offset voltage on capacitor charging time and the means to reduce this effect.
Figure 4:
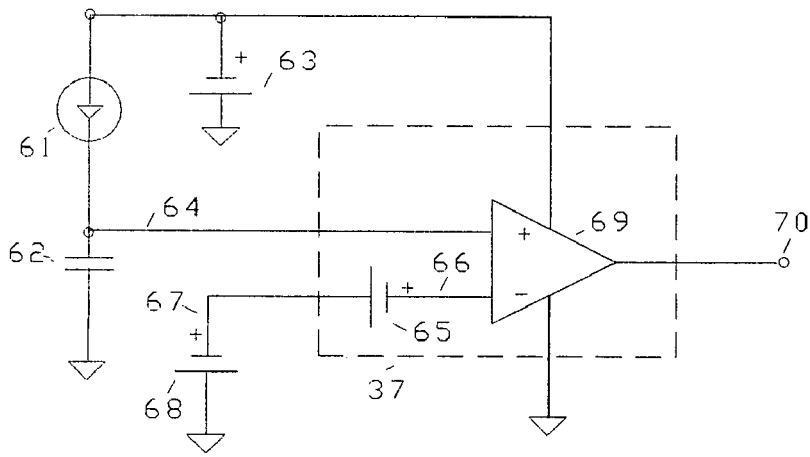
FIG. 4 shows the circuit of FIG. 3 with its comparator input connections reversed.
Figure 5:
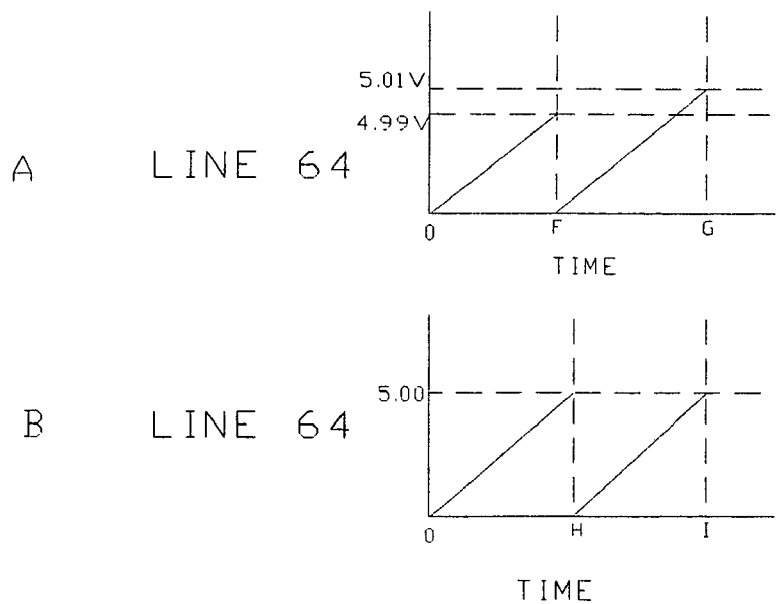
Fig 5a and 5b are diagrams illustrating various circuit waveforms of Fig 3 and Fig 4.

The invention's principle of operation is further clarified using the simplified circuits shown in FIG. 3 and FIG. 4 with FIG. 5 showing various circuit waveforms. Comparator 37 in FIG. 1 may be modeled by using comparator 69 with zero offset voltage and its actual offset voltage being represented by battery 65 in series with comparator 69 input line 66. Comparator 69 is powered by battery 63 and battery 68 sets its threshold voltage. Current source 61 charges timing capacitor 62. For purposes of illustration the following circuit values are used; Battery 63=10 volts, Battery 68=5 volts, Battery 65=0.01 volts, current source 61=1 ua, timing capacitor 62=1 uf.

Referring now to FIG. 3 and FIG. 5A at time 0 timing capacitor 62 is initially at 0 volts and begins being charged by current source 61. The voltage level on line 66 equal the sum of the timing capacitor 62 and battery 65. When voltage level of timing capacitor 62 exceeds 4.99 volts at time F the voltage level on line 66 exceeds the 5 volts on line 67 and the output of comparator 69 goes low. Inverter 71 is connected to comparator 69 output and the output of inverter 71 at terminal 70 goes high. The amount of time required for the timing capacitor 62 to reach 4.99 volts is 4.09×1e-6/1e-6=4.99 seconds as determined using the well know equation that the capacitor voltage equals the integral of current with time divided by capacitance.

Referring now to FIG. 4 timing capacitor 62 and battery 68 are now reversed in their connection to comparator 37 and timing capacitor 62 is reset to 0 volts. At time F in FIG. 5A capacitor 62 begins being charged again by current source 61. The voltage level on line 66 is 5.01 volts being equal the sum of battery 68 and battery 65. When voltage level of timing capacitor 62 exceeds 5.01 volts at time G, the voltage level on line 64 exceeds that on line 66 and comparator 69 output at terminal 70 goes high. The amount of time required for the timing capacitor 62 to reach 5.01 volts is 5.01×1e-6/1e-6=5.01 seconds. The time interval of 0 to G is 10 seconds. The average of the two time intervals 0 to F and F to G is equal to 5 seconds.

Referring again to FIG. 3 but this time comparator 37 is assumed to have zero offset voltage, and battery 65 is set to zero volts and can be ignored. Beginning at time 0 in FIG. 5B timing capacitor 62 is initially at 0 volts and begins being charging by current source 61. The voltage level on line 66 equal the sum of the timing capacitor 62 and battery 65. When voltage level of timing capacitor 62 exceeds 5.00 volts at time H, the voltage level on line 66 exceeds that on line 67 and comparator 69 output goes low. Inverter 71 is connected to comparator 69 output and the output of inverter 71 at terminal 70 goes high. The amount of time required for the timing capacitor 62 to reach 5.00 volts is 5.00×1e-6/1e-6=5.00 seconds. At time H timing capacitor 62 is again reset to 0 volts and charges to 5.00 volts at time I in another 5.00 seconds. The time interval of 0 to H is equal to that of H to I. The time interval of 0 to I is 10 seconds. The average of the two time intervals, 0 to H and H to I, is equal to 5 seconds.

The FIG. 5 time interval of 0 to G obtained using a comparator 39 with non zero offset voltage is equal to the time interval of 0 to I obtained using a comparator with zero offset voltage. By reversing the connections to the input of comparator 38 the effects of offset voltage on time period and its inverse, frequency, are reduced. This circuit technique also works when current source 61 is replaced by a resistor. The reduction in timing error caused by offset voltage is less but significant because the capacitor charging time is now non linear, but becomes more linear as the peak capacitor 62 voltage level is reduced.

Figure 6:
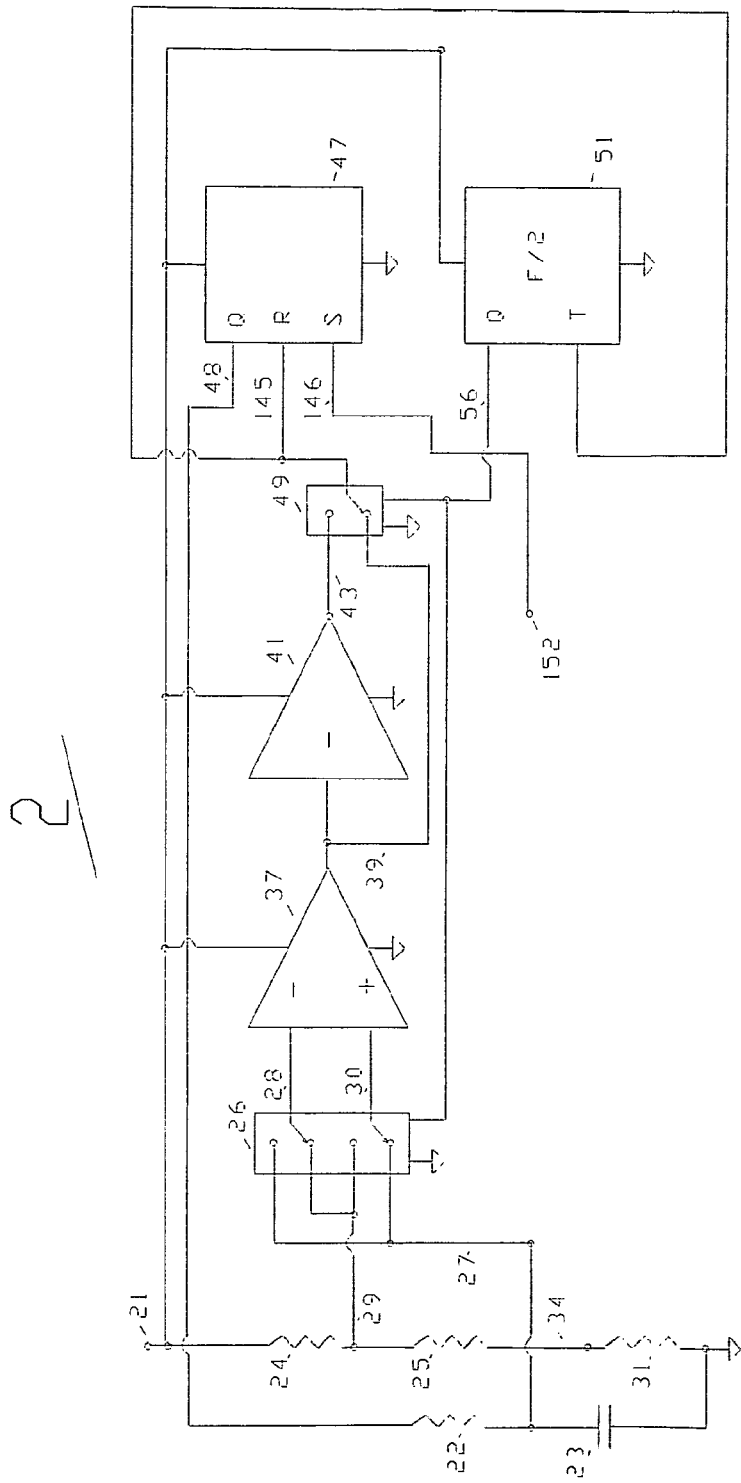
FIG. 6 is a schematic representation of monostable multivibrator 2 in accordance with one embodiment of the present invention.

FIG. 6 shows an exemplary monostable multivibrator 2 in accordance with an embodiment of the present invention. The DC input voltage is applied to terminal 21 and powers comparators 37, inverters 41, R S flip flop 47, and frequency divider 51. The multivibrator 2 output signal is on line 48. Switching means 26, and 49 may use relays or well known transistor circuits to accomplish the function.

Figure 7:
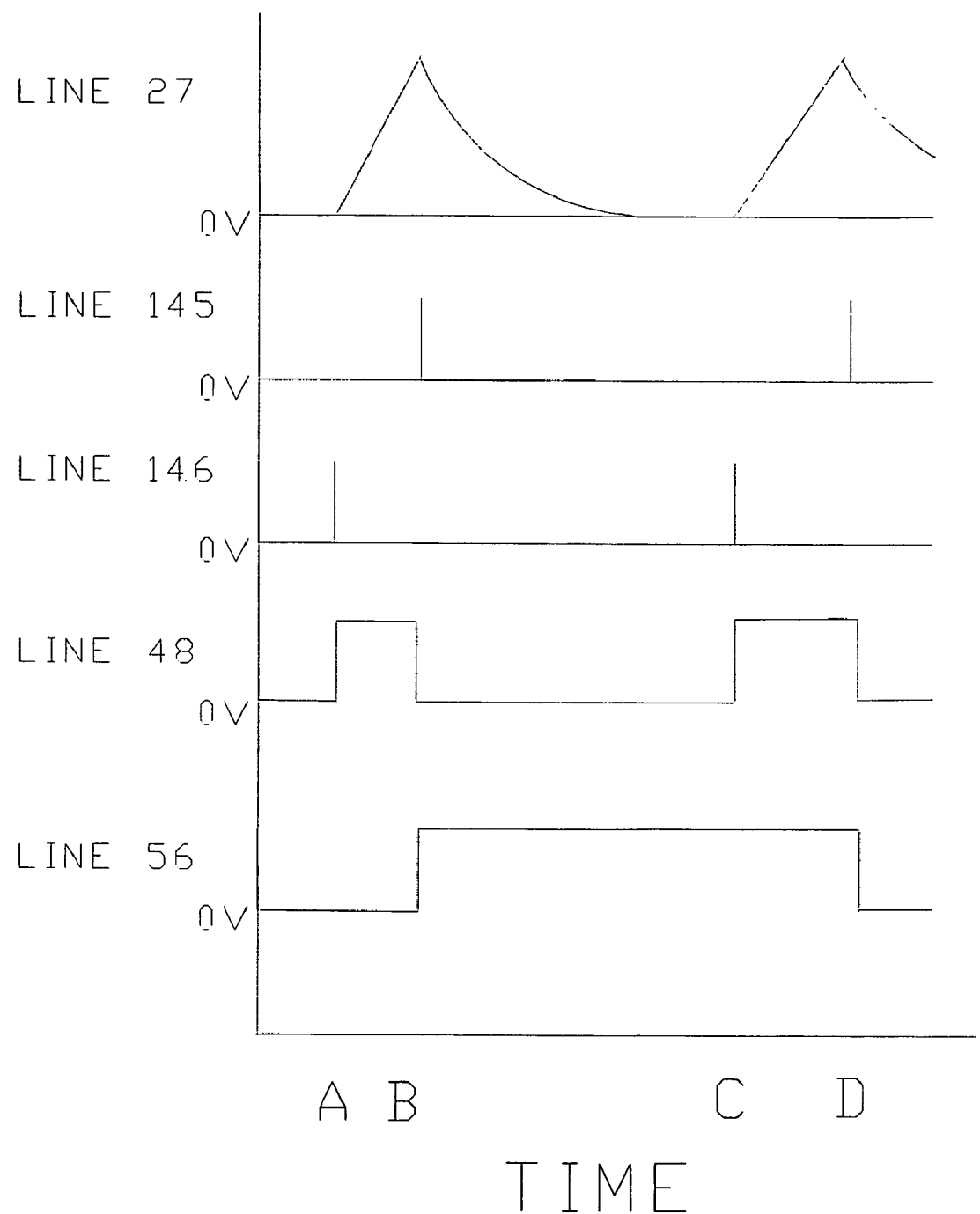
FIG. 7 is a diagram illustrating various monostable multivibrator 2 circuit waveforms.

Referring also to Fig.7, at time A an initiating trigger pulse is applied to input terminal 152 which is connected to the set input of R S flip flop 47 by line 146. This causes line 48 to go high (essentially equal to the DC input voltage level), and timing capacitor 23 begins charging through resistor 22. Instead of resistor 22, it is understood that current sources could have been used. The voltage level on line 27 is connected through switch means 26 to comparator 37 non inverting input line 30. DC reference voltages are obtained from the resistor voltage divider network consisting of resistors 24, 25, and 31 connected between terminal 21 and ground. The DC reference voltages on line 29 is higher than that on line 27. Line 29 is connected through switch means 26 to comparator 37 inverting input line 28.

At time B, the voltage level of timing capacitor 23 exceeds the DC reference voltage level on line 29 plus comparator 37 offset voltage, the output of comparator 37 output on line 39 goes high. Line 39 is connected through switch means 49 to input line 145 of R S flip flop 47, which functions as a latch, and frequency divider 51. R S flip flop 47 output on line 48 goes low (essentially 0 volts) and timing capacitor 23 begins being discharged through resistor 22. Also the output of frequency divider 51 on line 56 goes high causing switch means 26 and 49 to change connections. Comparator 37 input line 30 is now connected to line 29 and input line 28 is connected to line 27. Line 145 is now connected to the output of inverter 41 on line 43. The output of inverter 41 is the inverted signal level of comparator 37 output.

At time C an external trigger pulse is again applied to input terminal 152. This causes line 48 to go high (essentially equal to the DC input voltage level), timing capacitor 23 begins charging again through resistor 22 since the voltage level of timing capacitor 23 had already been discharged to essentially zero voltages between time B and C. The voltage level on line 27 is connected through switch means 26 to comparator 37 inverting input line 28. The DC reference voltages on line 29 is higher than that on line 27. Line 29 is connected through switch means 26 to comparator 37 non inverting input line 30. The output of comparator 37 is connected to the input of inverter 41. The output of inverter 41 on line 43 is now connected to line 145.

At time D, the voltage level of timing capacitor 23 exceeds the DC reference voltage level on line 29 minus comparator 37 offset voltage, the output of comparator 37 output on line 39 goes low and the output of inverter 41 goes high. R S flip flop 47 output on line 48 goes low and timing capacitor 23 begins being discharged through resistor 22. Also the output of frequency dividers 51 on line 56 goes low causing switch means 26 and 49 to change connections. Comparator 37 non inverting input line 30 is now connected to line 27 and inverting input line 28 is connected to line 29. Line 145 is now connected to the output of comparator 37 on line 39. Multivibrator 2 has now finished a complete cycle of operation and has returned to the same state as at time A.

I claim:

1. A precision, multivibrator, said multivibrator comprising:
    timing means for providing a signal that is responsive to time constant;
    means for providing a reference signal;
    comparator means having one or more inverting and non-inverting input pairs;
    switch means responsive to comparator means;
    said switch means for alternately reversing signal connections to said inverting and said non-inverting comparator means inputs by either connecting said timing means signal to said non-inverting input and said reference means signal to said inverting input or connecting said reference means signal to said non-inverting input and said timing means signal to said inverting input; and
    said comparator means responsive to said timing means signal and reference means signal, whereby average timing of the multivibrator output is a stable function of the difference between said timing means signal and said reference means signal.

2. A precision, astable multivibrator, said multivibrator comprising:
    timing means for providing a signal that is responsive to time constant;
    means for providing a reference signal;
    one or more comparator means responsive to said timing means signal and said reference means signal with each comparator means having both inverting and noninverting inputs;
    divider means responsive to said comparator means for controlling switch means;
    said switch means responsive to said divider means for alternately reversing signal connections to said inverting and non-inverting comparator means inputs by either connecting said timing means signal to said non-inverting input and said reference means signal to said inverting input or connecting said reference means signal to said non-inverting input and said timing means signal to said inverting input;
    latch means responsive to said comparator means for controlling said timing means; and
    said comparator means changing output state when the difference between said timing means signal and said reference means signal polarity changes, whereby average timing of the astable multivibrator output is a stable function of the difference between said timing means signal and said reference means signal.

3. A precision, monostable multivibrator responsive to an initiating trigger pulse, said multivibrator comprising:
    timing means for providing a signal that is responsive to time constant;
    means for providing a reference signal;
    one or more comparator means responsive to said timing means signal and said reference means signal with each comparator means having both inverting and non-inverting inputs;
    divider means responsive to said comparator means for controlling switch means;
    said switch means responsive to said divider means for alternately reversing signal connections to said inverting and non-inverting comparator means inputs by either connecting said timing means signal to said non-inverting input and said reference means signal to said inverting input or connecting said reference means signal to said non-inverting input and said timing means signal to said inverting input;
    latch means responsive to said comparator means and said initiating trigger pulse for controlling said timing means; and
    said comparator means changing output state when the difference between said timing means signal and said reference means signal polarity changes, whereby average timing of the one-shot multivibrator output over multiple pulse triggering is a stable function of the difference between said timing means signal and said reference means signal.

4. The precision, multivibrator of claim 1, in which said comparator means has further input offset error; and
    said alternately reversing signal connections to said inverting and non-inverting comparator input means reducing effect of said input offset error whereby average timing of the astable multivibrator output over multiple cycles of oscillation is a stable function of the difference between said timing means signal and said reference signal.

5. The precision, multivibrator of claim 4, in which both said timing means provided signal and reference signal are voltages.

6. The precision, astable multivibrator of claim 2, in which said comparator means has further input offset error; and
    said alternately reversing signal connections to said inverting and non-inverting comparator input means reducing effect of said input offset error whereby average timing of the astable multivibrator output over multiple cycles of oscillation is a stable function of the difference between said timing means signal and said reference signal.

7. The precision, astable multivibrator of claim 6, in which both said timing means provided signal and reference signal are voltages.

8. The precision, monostable multivibrator of claim 3, in which said comparator means has further input offset error; and said alternately reversing signal connections to said inverting and non-inverting comparator input means reducing effect of said input offset error whereby average timing of the monostable multivibrator output over multiple pulse triggering is a stable function of the difference between said timing means signal and said reference signal.

9. The precision, monostable multivibrator of claim 8, in which both said timing means provided signal and reference signal are voltages.

* * * * *